(12) United States Patent
Ma et al.

(10) Patent No.: US 7,620,942 B1
(45) Date of Patent: Nov. 17, 2009

(54) METHOD AND SYSTEM FOR PARAMETERIZATION OF IMPERATIVE-LANGUAGE FUNCTIONS INTENDED AS HARDWARE GENERATORS

(75) Inventors: Haibing Ma, Superior, CO (US); Roger B. Milne, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 912 days.

(21) Appl. No.: 10/850,176

(22) Filed: May 20, 2004

(51) Int. Cl.
G06F 9/45 (2006.01)

(52) U.S. Cl. .................. 717/136; 171/137; 171/138; 716/3; 716/18

(58) Field of Classification Search ......... 717/131–139; 716/3, 18
See application file for complete search history.

(56) References Cited

U.S. PATENT DOCUMENTS

| | | | |
|---|---|---|---|
| 5,841,663 A * | 11/1998 | Sharma et al. | 716/18 |
| 6,152,612 A * | 11/2000 | Liao et al. | 703/23 |
| 6,578,187 B2 * | 6/2003 | Yasuda | 716/18 |
| 6,606,734 B2 * | 8/2003 | Greaves | 716/4 |
| 6,708,321 B2 * | 3/2004 | Wheeler et al. | 716/18 |
| 2001/0034876 A1* | 10/2001 | Panchul et al. | 716/18 |
| 2002/0166110 A1* | 11/2002 | Powell | 717/106 |
| 2006/0036997 A1* | 2/2006 | Low | 717/113 |

OTHER PUBLICATIONS

Xilinx, Inc., original web page downloadable at least as early as May 20, 2004, program first released Oct. 2000, available from Xilinx, Inc., 2100 Logic Drive, San Jose, California, 95124.

* cited by examiner

*Primary Examiner*—Andy Ho
(74) *Attorney, Agent, or Firm*—Pablo Meles

(57) ABSTRACT

A method (100) of translating an imperative language function into a parameterized hardware component can include the steps of using (102) formal imperative function arguments to represent at least one among a component input port and a component parameter and distinguishing (104) between formal imperative function arguments intended as component parameters from formal imperative function arguments intended as component input ports. The method can generate (106) hardware description by providing a framework where imperative language functions can be translated into hardware components by being instantiated, combined and simulated. Arbitrary code can be associated (108) to a function-importing block as parameterization code and enabling an assignment of arbitrary code to actual imperative function arguments. The arbitrary code can be executed (110) in an interpreter that analyzes assigned variables by name and compares variable names with the formal argument identifiers in an imported function.

18 Claims, 6 Drawing Sheets

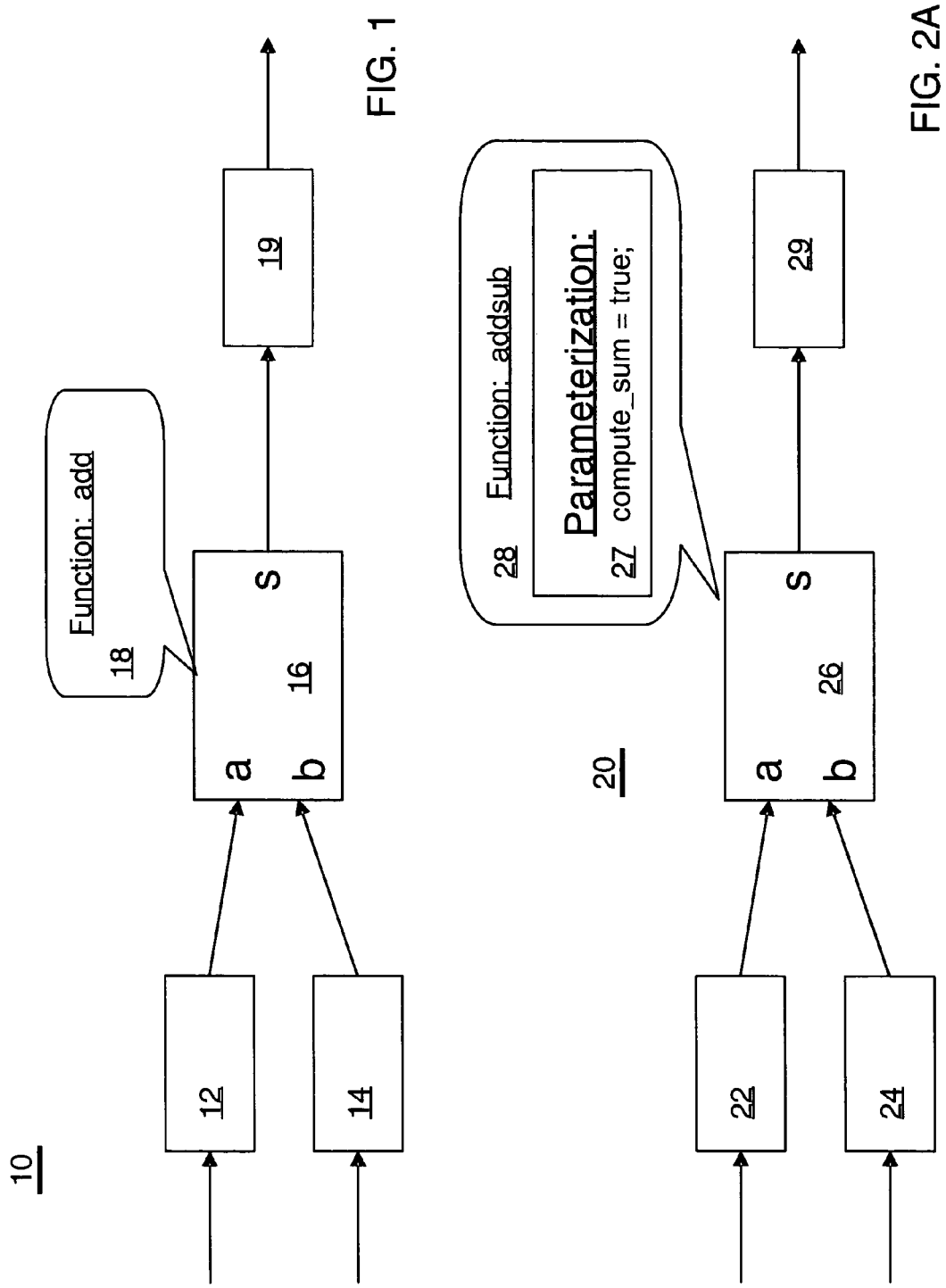

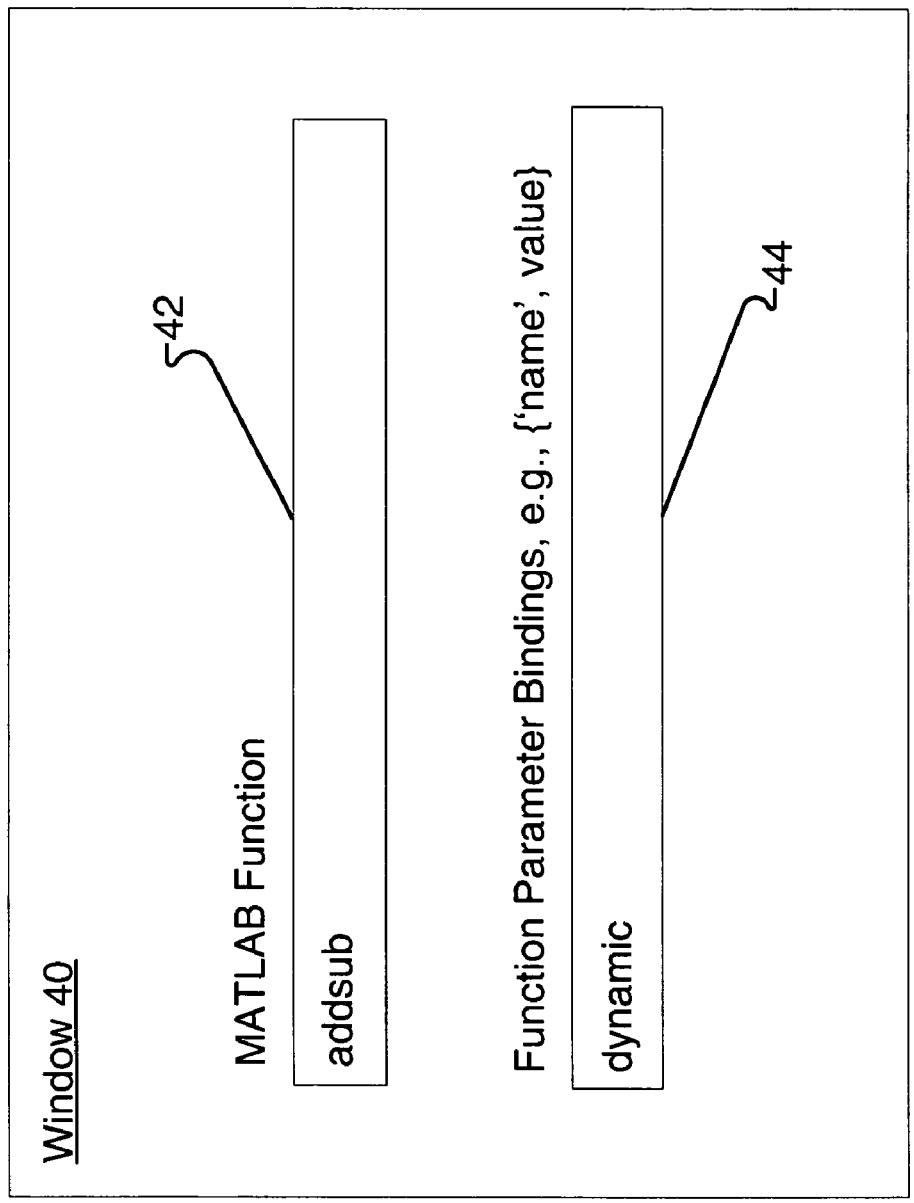

METHOD AND SYSTEM FOR PARAMETERIZATION OF IMPERATIVE-LANGUAGE FUNCTIONS INTENDED AS HARDWARE GENERATORS

BACKGROUND

1. Field of the Invention

The invention relates to the field of translation tools and more particularly to tools for translating imperative-language functions into hardware description language.

2. Description of the Related Art

Considerable interest exists for tools that translate functions written in an imperative programming language (e.g., C++, C, Java, MATLAB) into a component that can be implemented as hardware. Xilinx of San Jose, Calif. has a System Generator toolset that includes a tool that will translate certain functions written in the MATLAB language (an imperative, scripting language) into a synthesizable hardware description language (HDL) such as synthesizable VHDL or Verilog. Other companies such as AccelChip are developing similar and competing capabilities. AccelChip, for example, develops MATLAB language to hardware toolsets.

Translating a function written in an imperative language into a hardware component that has multiple inputs and multiple outputs is desirable. Fortunately, the MATLAB programming language has the desirable property of enabling a function to return multiple values, for example:

```
function[sum, diff]=addsub (a, b)
sum=a+b;
diff=a−b;
return;
```

The code above defines a function, "addsub," that returns two values, "sum" and "diff." Such a function is intuitively translated into a hardware component with two input ports (a, b) and two output ports (sum, diff). In this manner the imperative language has a function declaration syntax easily mapped into a component declaration in a Hardware Description Language (HDL). For example, the HDL equivalent of the MATLAB code above would appear as follows:

```
component addsub
port (
    a: in std_logic vector (15 downto 0);
    b: in std_logic_vector (15 downto 0);
    sum: out std_logic_vector (15 downto 0);
    diff: out std_logic_vector (15 downto 0)
);
end component;
```

Besides the function itself, it is also desirable to parameterize a hardware component so that it can implement a range of functionality, or so that it can use a range of architectural implementations. For example, it could be useful to create an addsub component that has two inputs (a, b) and one output (s), that can be parameterized such that each addsub instance either computes s=a+b or s=a−b. Traditional HDLs provide mechanisms (generics in VHDL, parameters in Verilog) by which components can be parameterized in this way. A parameterizable addsub component might be declared in VHDL using generics as follows:

```
component addsub
generic (
    compute_sum: boolean—if true, compute a+b, else
        compute a−b
);
port (
    a: in std_logic_vector (15 downto 0);
    b: in std_logic_vector (15 downto 0);
    s: out std_logic_vector (15 downto 0)
);
end component;
```

In translating imperative-language function definitions into hardware components, it would be useful to provide a similar component parameterization scheme. Most imperative languages do not have a syntax for a parameterized collection of functions. C++ is an exception with its function templating mechanisms as illustrated below:

```
template <bool compute_sum> int addsub (int a, int, b)
{
    int s;
    if (compute_sum) s=a+b;
        else s=a−b;
    return s;
}
```

Even with this mechanism, the proposition of translating templated, imperative functions into parameterized, hardware components is not very practical or attractive.

SUMMARY OF THE INVENTION

The present invention provides a method, system, and apparatus for translating an imperative language function into a parameterized hardware component. More particularly, an exemplary embodiment of the present invention provides a solution for representing both component inputs and component parameters.

One embodiment of the present invention can include a method of translating an imperative language function into a parameterized hardware component. The method can include the step of using formal imperative function arguments to represent at least one among a component input port and a component parameter and the step of distinguishing between formal imperative function arguments intended as component parameters from formal imperative function arguments intended as component input ports. The method can further include the step of generating hardware description by providing a framework where imperative language functions can be translated into hardware components by being instantiated, combined and simulated. The hardware components can be generated in a block-based and graphical format. The method can further include the step of associating the code to a function-importing block as parameterization code and enabling an assignment of code for actual imperative function arguments. The method can also execute code in an interpreter that analyzes assigned variables by name and compares variable names with formal argument identifiers in an imported function. Note that the distinction between formal and actual arguments is that the formal arguments are declared by the function and actual arguments are settings made by the caller or user. A hardware component can be represented using a dynamically selectable operation on a sample-by-sample basis. In other words, imperative language functions can be translated to hardware description language for runtime operation. Additionally, the method can mask output ports that are not translated.

In another embodiment of the present invention, a system for parameterizing imperative-language functions can include a means for representing at least one among a component input port and a component parameter using formal imperative function arguments and means for distinguishing between formal imperative function arguments intended as component parameters from formal imperative function arguments intended as component input ports. Further note that in each embodiment above, the formal imperative function arguments can represent one or more component input ports and/or one or more component parameters.

Other embodiments of the present invention, when configured in accordance with the inventive arrangements disclosed herein, can include a system for performing, and a machine readable storage for causing a machine to perform, the various processes disclosed herein.

BRIEF DESCRIPTION OF THE DRAWINGS

There are shown in the drawings, embodiments that are presently preferred, it being understood, however, that the invention is not limited to the precise arrangements and instrumentalities shown.

FIG. 1 is a graphic representation of inputs, outputs and an imported function in accordance with one embodiment of the inventive arrangements disclosed herein.

FIG. 2A is a graphic representation of inputs, outputs, and a parameterizable imperative function in accordance with one embodiment of the inventive arrangements disclosed herein.

FIG. 2C shows another example use of the simplified graphical user interface (GUI) window of FIG. 2B.

DETAILED DESCRIPTION OF THE INVENTION

Figure 2B:
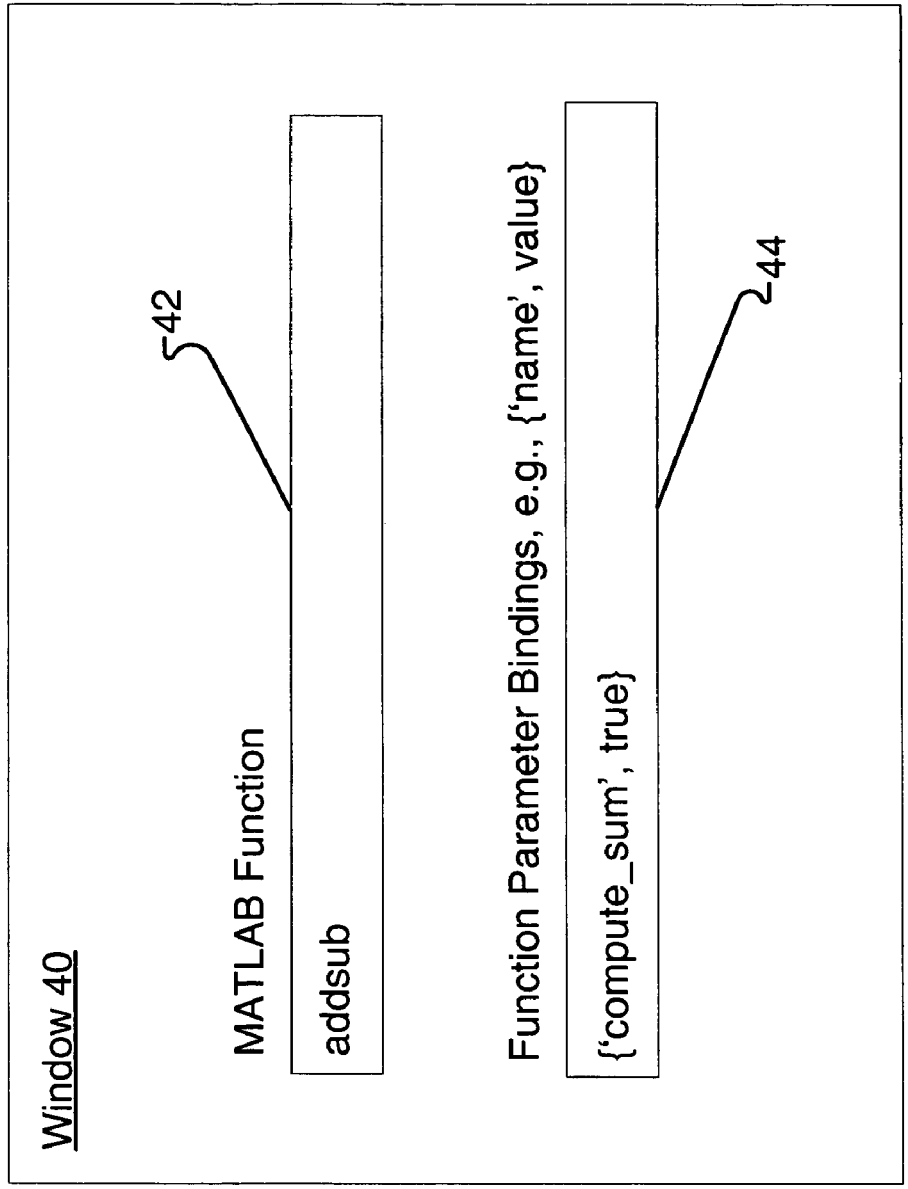
FIG. 2B is a simplified graphical user interface (GUI) window for inputting parameters of an embodiment of the present invention

A method of translating an imperative-language function into a parameterized hardware component can use the formal arguments of a function to represent both component inputs and component parameters. In the case of a MATLAB function, the definition for a addsub component can then be written as:

function s=addsub (a, b, compute_sum)
    if (compute_sum)
        s=a+b;
    else
        s=a−b;
    end;
    return;

A mechanism is disclosed for distinguishing formal arguments intended as parameters from those formal arguments intended for translation into component input ports in order appropriately translate imperative-language functions in accordance with embodiments of the present invention. A framework can be created where functions can be instantiated, combined, and simulated, and from which a hardware description can ultimately be generated. The framework can be part of a tool that translates imperative-language functions into hardware components. Conversely, the framework could include a toolset of which one or more tools are able to translate imperative-language functions into hardware components. A mechanism can be built that distinguishes parameter-arguments from input-arguments within the instantiating framework, and thereby avoid compromising the syntax used to specify functions in the imperative-language.

Xilinx Inc. of San Jose Calif., has a commercial System Generator software tool that provides a framework for assembling, simulating, and generating hardware components that is block-based and graphical (see the System Generator software tool available from Xilinx, In. of San Jose Calif. In this framework, blocks produce outputs as a function of their inputs and internal state, blocks are connected by arcs, and arcs conduct data between blocks. One of the blocks provided by the System Generator allows imperative functions written in the MATLAB language to be imported into the framework, to participate in the system simulation, and to be translated into the hardware realization of the system. The blocks can then be parameterized by the system designer in accordance with embodiments of the present invention.

Referring to FIG. 1, a schematic drawing illustrates how a function block 10 might be used in the System Generator framework. In this illustration the programmer has instanced the System Generator block that imports MATLAB functions and has parameterized this block such that it imports the following "add" function:

function s=add (a, b)
    s=a+b;
    return;

As illustrated, the function block 10 includes input blocks 12 and 14 corresponding to inputs a and b, an output block 19 corresponding to s, and a function block 16 having function 18.

In accordance with an embodiment of the present invention the proposed mechanism as shown in FIG. 2A can substantially use a block 26 similar to block 16 in FIG. 1 to import a parameterizable imperative function 28 having parameterization 27. Block 20 can include input blocks 22 and 24 corresponding to inputs a and b, an output block 29 corresponding to s, and a function block 26 having the function 28. The corresponding MATLAB function would look like:

function s=addsub (a, b, compute_sum)
    if (compute_sum)
        s=a+b;
    else
        s=a−b;
    end;
    return;

The above function in one embodiment of the present invention is created by the user and stored in a file called addsub.m. The file addsub.m is examined by an interpreter in conjunction with parameter definition information to determine which of the formal input arguments: a, b, and compute_sum, are input signals/variables and which, if any, are parameters.

FIG. 2B is a simplified graphical user interface (GUI) window 40 for inputting parameters of an embodiment of the present invention. The window 40 includes two user-input fields: MATLAB function 42 and function parameter bindings 44. The user types in for example, "addsub", which refers to the file "addsub.m" which includes the "function s" as described above. The user enters in field 44, for example, "{'compute_sum', true}, which indicates that the compute_sum formal argument in file addsub.m is a parameter with name "compute_sum" and with value of true. Thus when the interpreter evaluates addsub.m, a comparison is made against the formal input argument set {"a", "b", "compute_sum"}. When a match is found (e.g. for "compute_sum"), the value assigned or bound to a variable or constant (e.g., "true") is treated as a parameterization of block 26 in FIG. 2A. In addition "a" and "b" are mapped to input ports.

FIGS. 2A and 2B are GUIs, which provide a user an easy way to parameterize a function and to provide information for automatic generation of synthesizable HDL code. In the example of FIG. 2A, input blocks 22 and 24 in addition can be further described to include (not shown), for example, a UFix__16__14 (a 16 bit unsigned value with binary point at 14 bits) and output block 29 can be further described to include (not shown), for example, a Fix__17__14 (a 17 bit signed value with binary point at 14 bits). "APPENDIX A: ADDER" gives the synthesizable VHDL code generated for addsub.m of FIGS. 2A and 2B, and Appendix A is herein incorporated by reference. As Appendix A illustrates, one embodiment of the present invention, recognizes that as the parameter compute_sum is set as true, only the code for an adder need be generated.

Function block 20 is a simple example of how such a block could be parameterized. Xilinx's System Generator also provides several mechanisms that can be leveraged for more elaborate parameterizations. In particular, the System Generator or a proposed tool in accordance with an embodiment of the invention should support the use of scripting language constructs for the specification of block parameters (e.g. block parameters can be assigned using MATLAB expressions and functions). The System Generator can provide graphical user interfaces for block parameterization. It also supports the use of scripting and compiled imperative languages (including MATLAB, Java, Python) for the programmatic instantiation and parameterization of blocks and block diagrams. In all cases, blocks and block-parameterizations of arbitrary complexity are supported. While the examples provided herein are sufficient to illustrate a few mechanisms in accordance with embodiments herein, it should be understood that the benefits of such mechanisms become more pronounced as the complexities of the system and its components increase.

FIG. 2C shows another example use of the simplified graphical user interface (GUI) window 40. Field 44 has the name of a MATHLAB file "dynamic" for dynamic.m generated by or supplied to the user. The file dynamic.m will be evaluated by the interpreter to produce a parameter definition list and the interpreter will then evaluate the parameter definition list in conjunction with the file addsub.m to produce synthesizable VHDL code. An example of the file dynamic.m looks as follows:

```
function plist=dynamic( )
  switch (day_of_week (now))
    case {'Mon', 'Tue'}
      plist={'compute_sum', false};
    otherwise
      plist={'compute_sum', true};
  end
return;
```

This file has a function "plist" for parameter list, which sets the parameter compute_sum to false (Monday or Tuesday) or true (Wednesday to Sunday) depending on the day of the week the code is interpreted. For example, on Monday the parameter compute_sum will be automatically bound to false, hence in conjunction with the file addsub.m as specified in filed 42 of FIG. 2C an embodiment of the present invention will generate VHDL code for a subtracter. As another example, on Friday the parameter compute_sum will be automatically bound to true, hence in conjunction with the file addsub.m as specified in filed 42 of FIG. 2C the embodiment will generate VHDL code for an adder (see Appendix A). Thus the parameter binding may be dynamically determined. Thus different synthesizable HDL code, e.g., an adder only or a subtracter only, is generated depending on a value of a parameter set at run time, for example, in this embodiment, when the code is interpreted.

For a Programmable Logic Device (PLD) such as a Field Programmable Gate Array (FPGA) (e.g., the Virtex-II Pro FPGA from Xilinx Inc. of San Jose, Calif.) that can be configured and reconfigured, including partial reconfiguration (i.e., part of the FPGA is reconfigured while another part of the FPGA remains fully operational), the FPGA may be reconfigured over time with different designs, for example, adder or subtracter, depending on the value of the parameter, e.g., compute_sum=true or compute_sum=false, Thus the parameter may be statically (FIG. 2B) or dynamically (FIG. 2C) set.

In another embodiment of the present invention the parameter definition list with associated parameter bindings may be generated by a piece of code, for example, "myvar( )" below. Let the field 44 in FIG. 2C have the term dynamic2 referring to the dynamic2.m MATHLAB file having the parameter candidates for addsub.m. The file dynamic2.m includes:

```
function plist=dynamic2( )
  switch (day_of_week (now))
    case {'Mon', 'Tue'}
      compute_sum=false;
    otherwise
      compute_sum=true;
  end
  temp=3.14;
  plist=myvars;
return;
function L=myvars( )
  w=evalin ('caller', 'who');
  L={ };
  for i=1:length (w)
    L{end+1}=w{i};
    L{end+1}=evalin ('caller', w{i});
  end
return;
```

When the above file dynamic2.m is interpreted, a parameter binding array on, for example Monday, is generated having: {'compute_sum', false, 'temp', 3.14}. The interpreter, when comparing the parameter binding array with the addsub.m file (formal input arguments: a, b, compute_sum) discards {'temp', 3.14} as not being a parameter for addsub.m. Thus the parameter and parameter binding for addsub.m is {'compute_sum', false} on Mondays (or Tuesdays) and the synthesizable HDL code for a subtracter is created.

In an aspect of the present invention the field 44 in FIG. 2C could allow "function plist dynamic2( )" to be typed in directly as:

```
switch (day_of_week (now))
  case {'Mon', 'Tue'}
    compute_sum=false;
  otherwise
    compute_sum=true;
end
temp=3.14;
```

The function L=myvar( ) (in this case, hidden from the user) to create the parameter binding array, e.g., {'compute_sum', false, 'temp', 3.14}, would be automatically run after the above function dynamci2( ) is entered.

Accordingly, a designer is able to parameterize imperative-language-function blocks through a variety of means. One important means allows arbitrary code to be written in the MATLAB language and assign arbitrary variables. The code source is associated to the function-importing block as parameterization code. The MATLAB language code can be executed in an interpreter and then a list of all assigned variables can be examined by name, comparing the variable names against the argument identifiers in the imported function.

Figure 3A:
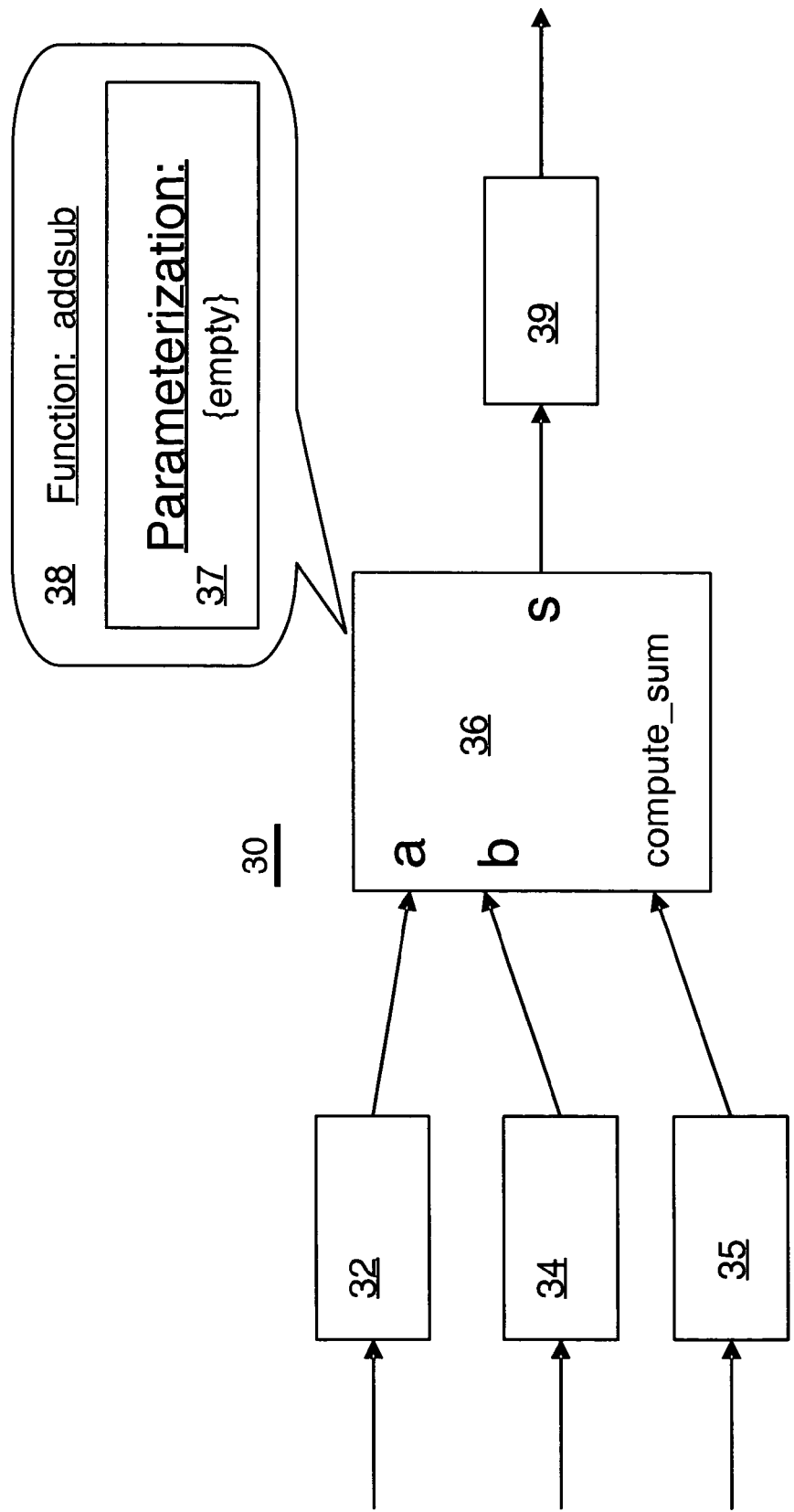
FIG. 3A is another graphic representation illustrating optional ports for a single parameterizable imperative function in accordance with one embodiment of the inventive arrangements disclosed herein.

In yet another embodiment, the proposed mechanism enables a user to specify hardware components with variable external views (optional ports) by writing a single imperative language function. Returning to the example of the addsub function, both a parameterized two input block (a, b) (FIGS. 2A-C) as well as a three input block (a, b, compute_sum) as shown in FIG. 3A can be created. A function block 30 can import a parameterizable imperative function 38 having parameterization 37. Block 30 can include input blocks 32 and 34 corresponding to inputs a and b, an output block 39 corresponding to output s, and a function block 36 having the function 38. As shown in FIG. 3A, the block 30 can also include the optional input block 35 corresponding to argument compute_sum. Block 35 implies a hardware component whose operation (addition or subtraction) can be selected while the circuit is running, on a sample-by-sample basis.

Figure 3B:
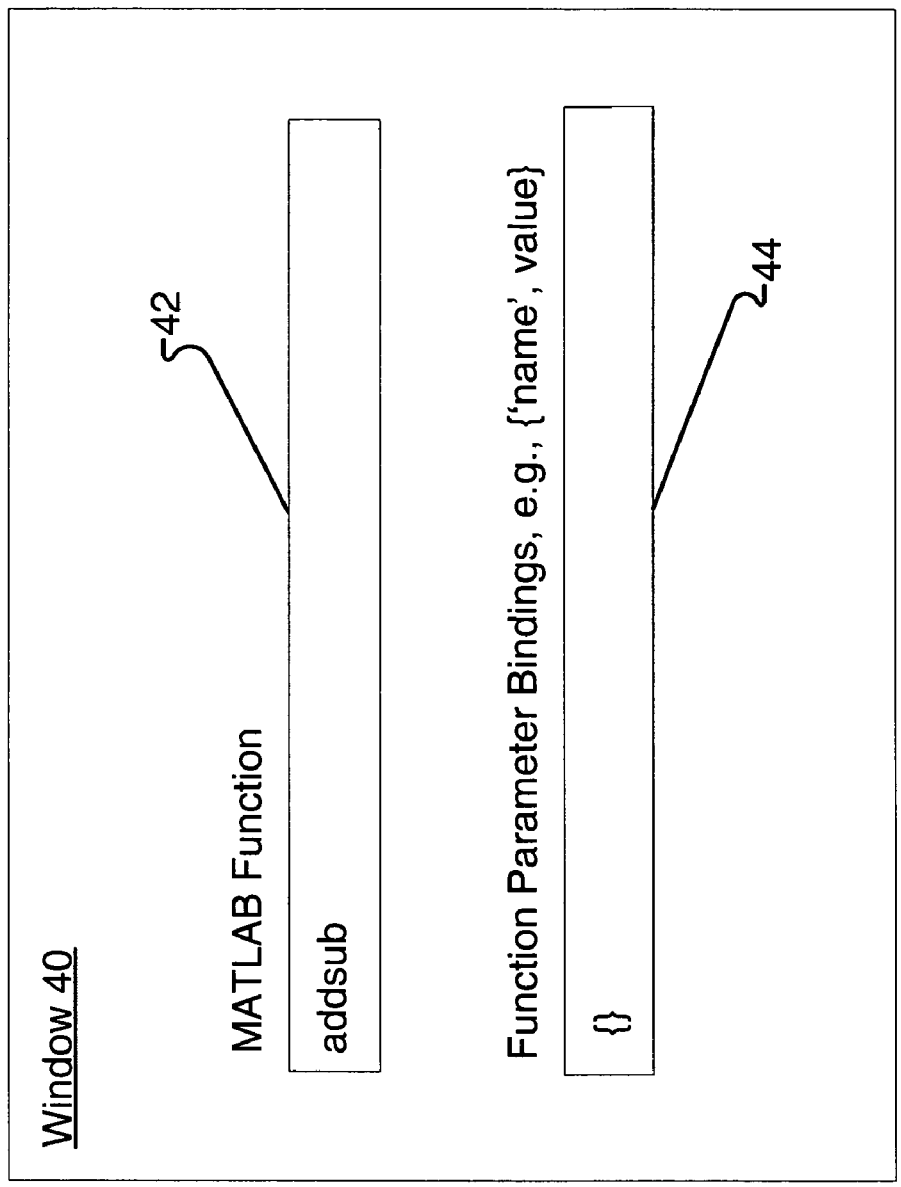
FIG. 3B shows yet another example use of the simplified graphical user interface (GUI) window of FIG. 2B.

FIG. 3B is similar to FIGS. 2B and 2C except that field 44 has "{ }" entered into it. "{ }" represents the empty set and indicates to the interpreter that all input formal arguments, e.g., "a, b, and compute_sum", in addsub.m are to be treated as input ports (a 32, b 34, compute_sum 35, respectively), i.e., there are no parameters. The VHDL synthesizable code for an adder/subtracter is given in Appendix B, which is herein incorporated by reference.

With the block 30 in this configuration, the System Generator software or other similarly configured tool can translate the code into hardware that supports a runtime operation code, instead of a simple adder or subtracter. Conversely, when the block is parameterized into a single mode of operation (always adding or always subtracting), the software optimizes the generated hardware for that operation, and a simple adder or subtracter is produced.

Additionally, a mechanism by which a designer can mask off output ports that are not needed on a particular block instance can be done through the specification of a list of strings, identifying block outputs that are to be excluded, e.g.:

exclude: {"some_output", "some_other_output"}

So-named outputs of the function are then not translated into block outputs. This mechanism reduces diagram clutter, but also easily allows the reduction of the simulation model and the generated hardware description such that the unneeded results are not computed.

In an alternative embodiment of the present invention another GUI window is displayed having a pull down menu with, for example, the following user selectable choices: "Add", "Subtract", or "Add or subtract based on input pin". This would then automatically set "compute_sum=false", "compute_sum=true", or "{ }" (i.e., no parameters), respectively.

Another alternative is to always present the block such that all function arguments are displayed as block inputs and to have the user tie inputs to constants as a way of parameterizing the block (and unneeded outputs are left dangling). While this mechanism is functionally equivalent to the proposed mechanism, it is less desirable in terms of the interface. The proposed interface as illustrated in FIGS. 2 and 3 has significant advantages in terms of clarity and expressivity. Clarity can result from the parameterization of blocks through controls on the block, not through the tying of inputs to constants. Ease of expression can result because the parameterization can be more richly described through a programmatic, language based interface.

Figure 4:
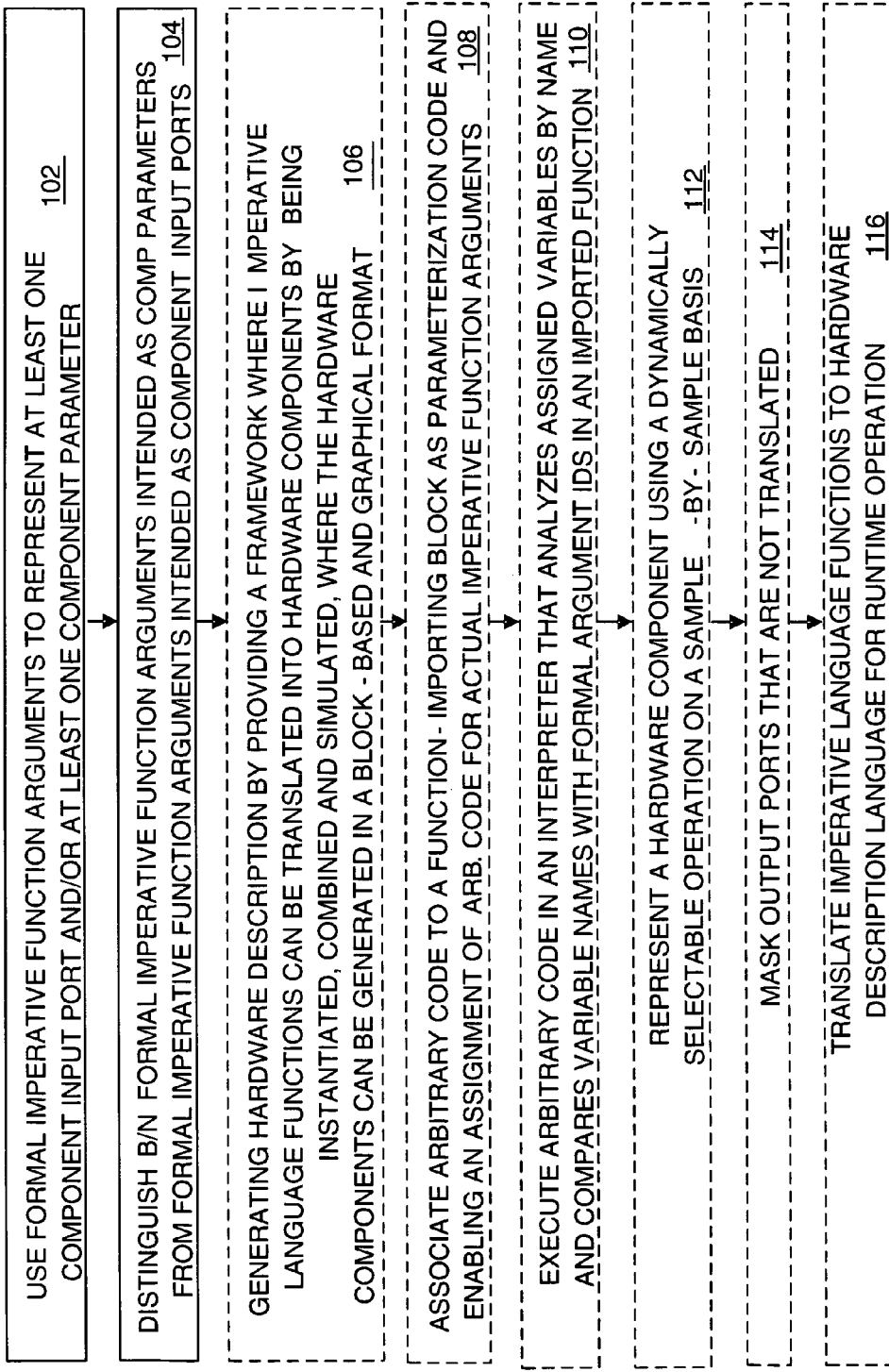
FIG. 4 is a flow chart illustrating a method of translating an imperative language function into a parameterized hardware component in accordance with an embodiment of the present invention.

FIG. 4 is a flow chart illustrating a method 100 of translating an imperative language function into a parameterized hardware component. The method 100 can include the step 102 of using imperative function arguments to represent at least one component input port or at least one component parameter and the step 104 of distinguishing between formal imperative function arguments intended as component parameters from formal imperative function arguments intended as component input ports. The manner in which an imperative language function can be translated can be done in numerous ways and with a variety of optional and/or alternative steps. Such alternative or optional steps for the method 100 can further include the step 106 of generating hardware description by providing a framework where imperative language functions can be translated into hardware components by being instantiated, combined and simulated. The hardware components can be generated in a block-based and graphical format. The method 100 can further include the step 108 of associating the arbitrary code to a function-importing block as parameterization code and enabling an assignment of arbitrary code for the imperative function arguments. The arbitrary code can be executed in an interpreter that analyzes assigned variables by name and compares variable names with argument identifiers in an imported function at step 110. A hardware component can be represented using a dynamically selectable operation on a sample-by-sample basis at step 112. Additionally, the method 100 can mask output ports that are not translated at step 114. In another related aspect, imperative language functions can be translated to hardware description language for runtime operation at step 116.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

An further embodiment of the present invention includes a system having software stored on a computer readable medium for creating hardware description language (HDL) code (e.g., VHDL or Verilog) from a programming language function (written in for example System C, C++, Java, Smalltalk, C#, Basic, VBA). The software includes: code for describing the programming language function having a plurality of formal input arguments; code for determining which, if any, of the plurality of formal input arguments are parameters; code for assigning a value to a parameter if the code for determining identifies the parameter in the plurality of formal input arguments; and code for generating synthesizable HDL code based on the code for determining and code for assigning, for example, based on the value statically or dynamically assigned to or bound to the parameter.

In addition, if none of the plurality of formal input arguments are determined to be parameters, then the code for assigning a value is not executed and the synthesizable HDL code generated has all of the plurality of formal input arguments as input ports. The software may further include code for configuring or reconfiguring a programmable logic device (PLD), for example an FPGA, using the synthesizable HDL code and/or the synthesizable HDL code may be used to form an application specific circuit (ASIC) as known to one of ordinary skill in the arts.

This invention can be embodied in other forms without departing from the spirit or essential attributes thereof. Accordingly, reference should be made to the following claims, rather than to the foregoing specification, as indicating the scope of the invention.

APPENDIX A

Adder

```
library IEEE;
use IEEE.std_logic_1164.all;
use IEEE.numeric_std.all;
use work.conv_pkg.all;
entity addsub_matlab_function is
  port (
    a: in std_logic_vector (16-1 downto 0);
    b: in std_logic_vector (16-1 downto 0);
    s: out std_logic_vector (17-1 downto 0);
    clk: in std_logic;
    ce: in std_logic;
    clr: in std_logic);
end addsub_matlab_function;
architecture behavior of addsub_matlab_function is
begin
  process_x__000000: process (a, b) is
  variable a_x__000000: unsigned (16-1 downto 0);
  variable b_x__000000: unsigned (16-1 downto 0);
  variable s_x__000000: unsigned (17-1 downto 0);
  variable s_x__000001: unsigned (17-1 downto 0);
  variable s_x__000002: unsigned (17-1 downto 0);
  procedure procedure_x__000000 is
  begin
    a_x__000000:=std_logic_vector_to_unsigned (a);
    b_x__000000:=std_logic_vector_to_unsigned (b);
    s_x__000002:=u2u_cast (a_x__000000, 14, 17, 14)+
      u2u_cast (b_x__000000, 14, 17, 14);
    s_x__000001:=s_x__000002;
    s<=unsigned_to_std_logic_vector (s_x__000001);
  end;
  begin
  procedure_x__000000;
  end process process_x__000000;
end behavior;
```

APPENDIX B

Adder/Subtracter

```
library IEEE;
use IEEE.std_logic_1164.all;
use IEEE.numeric_std.all;
use work.conv_pkg.all;
entity addsub_matlab_function is
  port (
    a: in std_logic_vector (16-1 downto 0);
    b: in std_logic_vector (16-1 downto 0);
    compute_sum: in std_logic_vector (1-1 downto 0);
    s: out std_logic_vector (18-1 downto 0);
    clk: in std_logic;
    ce: in std_logic;
    clr: in std_logic);
end addsub_matlab_function;
architecture behavior of addsub_matlab_function is
begin
  process_x__000000: process (a, b, compute_sum) is
  variable a_x__000000: unsigned (16-1 downto 0);
  variable b_x__000000: unsigned (16-1 downto 0);
  variable compute_sum_x__000000: boolean;
  variable s_x__000000: signed (18-1 downto 0);
  variable s_x__000001: signed (18-1 downto 0);
  variable s_x__000002: unsigned (17-1 downto 0);
  variable s_x__000003: signed (18-1 downto 0);
  procedure procedure_x__000000 is
  begin
    a_x__000000:=std_logic_vector_to_unsigned (a);
    b_x__000000:=std_logic_vector_to_unsigned (b);
    compute_sum_x__000000:=compute_sum=
    if compute_sum_x__000000 then
      s_x__000002:=u2u_cast (a_x__000000, 14, 17, 14)+
        u2u_cast (b_x__000000, 14, 17, 14);
      s_x__000001:=u2s_cast (s_x__000002, 14, 18, 14);
    else
      s_x__000003:=u2s_cast (a_x__000000, 14, 18, 14)−
        u2s_cast (b_x__0000000, 14, 18, 14);
      s_x__000001:=s_x__000003;
    end if;
    s<=signed_to_std_logic_vector (s_x__000001);
  end;
  begin
  procedure_x__000000;
  end process process_x__000000;
end behavior;
```

What is claimed is:

1. A method of translating an imperative language function into a hardware component, comprising the steps of:
   using a formal imperative function argument to represent at least one among a component input port and a component parameter;
   distinguishing between formal imperative function arguments intended as component parameters and formal imperative function arguments intended as component input ports within an instantiating framework; and
   translating imperative language functions to hardware description language for runtime operation.

2. The method of claim 1, wherein the method further comprises the step of generating hardware description by providing a framework where imperative language functions can be translated into hardware components by being instantiated, combined and simulated.

3. The method of claim 2, wherein the hardware components are generated in a block-based and graphical format.

4. The method of claim 1, wherein the method further comprises the step of enabling an assignment of code for actual imperative function arguments.

5. The method of claim 4, wherein the method further comprises the step of associating the code to a function-importing block as parameterization code.

6. The method of claim 1, wherein the method further comprises the step of executing code in an interpreter that analyzes assigned variables by name and compares variable names with formal argument identifiers in an imported function.

7. The method of claim 1, wherein the method further comprises the step of representing the hardware component using a dynamically selectable operation on a sample-by-sample basis.

8. The method of claim 1, wherein the method comprises the step of masking at least one among a plurality of output ports that are not translated.

9. A system for parameterizing imperative-language functions, comprising:
   a processor;
   means for representing at least one among a component input port and a component parameter using formal imperative function arguments; and
   means for distinguishing between formal imperative function arguments intended as component parameters from formal imperative function arguments intended as component input ports using the processor within an instantiating framework.

10. The system of claim 9, wherein the system further comprises a hardware description generator providing a framework where imperative language functions can be translated into hardware components by being instantiated, combined and simulated.

11. The system of claim 10, wherein the hardware components are generated in a block-based and graphical format.

12. The system of claim 9, wherein the system further comprises an interpreter that executes code and analyzes assigned variables by name and compares variable names with formal argument identifiers in an imported function.

13. The system of claim 9, wherein the system further comprises a means of representing a hardware component having dynamically selectable operation on a sample-by-sample basis.

14. The system of claim 13, wherein the system further comprises means for translating imperative language functions to hardware description language for runtime operation.

15. The system of claim 9, wherein the system further comprises means for masking at least one among a plurality of output ports that are not translated.

16. A machine readable storage medium, having stored thereon a computer program having a plurality of code sections executable by a machine for causing the machine to perform the steps of:
   representing at least one among a component input port and a component parameter using formal imperative function arguments;
   distinguishing between formal imperative function arguments intended as component parameters from formal imperative function arguments intended as component input ports within an instantiating framework; and
   representing a hardware component having dynamically selectable operation on a sample-by-sample basis using hardware description language suitable for runtime operation.

17. The machine readable storage medium of claim 16, wherein the computer program further comprises code sections for causing the machine to generate hardware description providing a framework where imperative language functions can be translated into hardware components by being instantiated, combined and simulated.

18. The machine readable storage medium of claim 16, wherein the computer program further comprises code sections for causing the machine to execute code, analyze assigned variables by name, and compare variable names with a formal argument identifier in an imported function.

* * * * *

UNITED STATES PATENT AND TRADEMARK OFFICE
CERTIFICATE OF CORRECTION

PATENT NO.       : 7,620,942 B1                                            Page 1 of 1
APPLICATION NO.  : 10/850176
DATED            : November 17, 2009
INVENTOR(S)      : Ma et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1581 days.

Signed and Sealed this

Twenty-sixth Day of October, 2010

David J. Kappos
*Director of the United States Patent and Trademark Office*